US008868364B2

(12) United States Patent
Antonesei

(10) Patent No.: US 8,868,364 B2
(45) Date of Patent: Oct. 21, 2014

(54) APPARATUS AND METHOD FOR REAL TIME HARMONIC SPECTRAL ANALYZER

(75) Inventor: Gabriel Antonesei, Woburn, MA (US)

(73) Assignee: Analog Devices, Inc., Norwood, MA (US)

(*) Notice: Subject to any disclaimer, the term of this patent is extended or adjusted under 35 U.S.C. 154(b) by 469 days.

(21) Appl. No.: 13/098,305

(22) Filed: Apr. 29, 2011

(65) Prior Publication Data

US 2012/0278020 A1    Nov. 1, 2012

(51) Int. Cl.
*G01R 23/02* (2006.01)
*G01R 21/133* (2006.01)
*G01R 19/25* (2006.01)

(52) U.S. Cl.
CPC .......... *G01R 19/2513* (2013.01); *G01R 21/133* (2013.01)
USPC .......................................................... 702/75

(58) Field of Classification Search
CPC ...................................................... G01R 23/02
USPC ............................................................ 702/75
See application file for complete search history.

(56) References Cited

U.S. PATENT DOCUMENTS

| | | | |
|---|---|---|---|
| 3,984,771 A | 10/1976 | Nossen et al. | |
| 4,224,671 A | 9/1980 | Sugiyama et al. | |
| 4,878,185 A | 10/1989 | Brand et al. | |
| 5,321,350 A | 6/1994 | Haas | |
| 5,381,085 A | 1/1995 | Fischer | |
| 5,483,153 A | 1/1996 | Leeb et al. | |
| 5,572,167 A | 11/1996 | Alder et al. | |
| 5,587,917 A | 12/1996 | Elms | |
| 6,016,080 A | 1/2000 | Zuta et al. | |
| 6,078,870 A * | 6/2000 | Windsheimer | 702/61 |
| 6,397,157 B1 | 5/2002 | Hogle et al. | |
| 7,756,487 B2 | 7/2010 | Lerner et al. | |
| 8,010,304 B2 | 8/2011 | Lu et al. | |
| 8,508,303 B2 | 8/2013 | Maeda | |
| 2004/0022338 A1 | 2/2004 | Altmann et al. | |
| 2005/0096879 A1 | 5/2005 | Waite et al. | |
| 2005/0159929 A1 | 7/2005 | Overby et al. | |
| 2009/0088113 A1* | 4/2009 | Marsili et al. | 455/260 |

(Continued)

FOREIGN PATENT DOCUMENTS

WO        02/091578 A2      11/2002

OTHER PUBLICATIONS

Best, Roland E., "Phase-Locked Loops—Design, Simulation, and Applications," 6th Ed., McGraw-Hill 2007, Chapter 2, pp. 13-37.

(Continued)

*Primary Examiner* — Jonathan C Teixeira Moffat
*Assistant Examiner* — Joseph J Yamamoto
(74) *Attorney, Agent, or Firm* — Kenyon & Kenyon, LLP

(57) ABSTRACT

In one embodiment, a measuring device may comprise two oscillators. The first oscillator may generate a local reference signal in a frequency detector to detect a fundamental frequency of the alternating current (AC). The second oscillator may generate two substantially mutually orthogonal sinusoid signals having the selected frequency. The measuring device further may comprise a first group of multipliers that mixes the two sinusoid signals with a current and a voltage data signal of the AC respectively, a group of low-pass filters for removing high frequency components from the multiplication products, a second group of multipliers for mixing the filtered multiplication products respectively, and a plurality of adders each to sum together a pair of multiplication products of the second group of multipliers.

44 Claims, 4 Drawing Sheets

(56) References Cited

U.S. PATENT DOCUMENTS

2009/0307293 A1 12/2009 Wu et al.
2010/0088049 A1* 4/2010 Lu et al. ............................ 702/60
2010/0213925 A1 8/2010 Teodorescu et al.

OTHER PUBLICATIONS

International Search Report and Written Opinion dated Aug. 17, 2012 in PCT/US2012/035256, filed Apr. 26, 2012.
International Search Report and Written Opinion dated Aug. 3, 2012 in PCT/US2012/035261, filed Apr. 26, 2012.
Cirrus Logic, "C55463: Single Phase, Bi-directional Power/Energy IC," Datasheet DS678F2, Apr. 2008.
Maxim Integrated Products, "MAXQ3183: Low-Power, Multifunction, Polyphas AFE with Harmonics and Tamper Detect," Datasheet 19-4955, Dec. 2009.
Moreira et al., "Virtual Instrumentation Applied to the Implementation of IEEE STD 1459-2000 Power Definitions", Proceedings of the 36th IEEE Power Electronics Specialists Conference (PESC '05), Jun. 16, 2005, pp. 1712-1718.
Cataliotti, et al., "A Time-Domain Strategy for the Measurement of IEEE Standard 1459-2000 Power Quantities in Nonsinusoidal Three-Phase and Single-Phase Systems", IEEE Transactions on Power Delivery, vol. 23, No. 4, Oct. 2008, pp. 2113-2123.
Tahri et al., "Design of a Simple Measuring Technique of the Instantaneous Power in Three Phase System", Journal of Electrical Engineering, vol. 56, No. 7-8, 2005, pp. 221-224.
Matsui et al., "A Simple Harmonic Meter Using Phase Locked Loop", Proceedings of the 24th Annual Conference of the IEEE Industrial Electronics Society (IECON '98), Sep. 1998, pp. 1550-1553.
International Preliminary Report on Patentability issued Apr. 5, 2011, for International application No. PCT/US2009/059352, 8 pages.

* cited by examiner

APPARATUS AND METHOD FOR REAL TIME HARMONIC SPECTRAL ANALYZER

RELATED APPLICATION

This application relates to co-pending application "SYSTEM AND METHOD FOR DETECTING A FUNDAMENTAL FREQUENCY OF AN ELECTRIC POWER SYSTEM," application Ser. No. 13/097,796, also filed Apr. 29, 2011.

FIELD OF THE INVENTION

The present invention is generally directed to a device and method for measuring power in an electrical power system. In particular, the present invention is directed to a device and method for measuring power at a fundamental frequency or at harmonic frequencies using a frequency detector and a dual-channel digitally controlled Oscillator.

BACKGROUND INFORMATION

Electricity is commonly delivered from electricity suppliers to consumers in the form of alternating current (AC) at a certain fundamental frequency, e.g., 60 Hz in the U.S. The consumption of electricity, e.g., three-phase AC, is commonly measured by power meters. When the load of an power supply system includes non-linear components, harmonic frequencies, other than the fundamental frequency, might be created on the power supply line. Additionally, when the load is not purely resistive, the waveform of voltage V may lead or lag the waveform of current I in time or have a phase offset in the frequency domain.

Electrical power at each frequency may include three components: apparent power ($P_{app}$), active power ($P_{act}$), and reactive power ($P_{react}$). The apparent power $P_{app}(w)$ for a particular angular frequency w may be defined as the product of magnitudes of voltage $V(w)$ and current $I(w)$, i.e., $P(w)=V(w)*I(w)$. The active power $P_{act}(w)$ may be defined as the capacity of the load at a particular time or the energy that flows from power source to the load. The reactive power $P_{reactive}(W)$ may be defined as the energy that is bounced back from the load to the source. If the phase offset between current and voltage is $\phi$, then $P_{act}(w)=P_{app}(w)*|Cos(\phi)|$ and $P_{react}(w)=P_{app}(w)*|Sin(\phi)|$.

When the number of non-linear loads, e.g., switching power supplies, increases, a larger amount of harmonic content may be present in the power system. These harmonics may limit the effectiveness of the power system to deliver electrical power from a source to a load. The combination of digital signal processing (DSP) and high performance analog to digital converters (ADCs) at low prices provides electrical power suppliers with new options for improving and optimizing electrical power meters. The owner suppliers may want to know how much electrical power is delivered not only at the fundamental frequency but also at harmonic frequencies. Also, the supplier of energy may want to know about the existence of harmonics because these harmonics have the potential of damaging some delivery equipment (e.g., wires and transformers).

Current techniques for computing power at a fundamental frequency or harmonic frequencies are mostly based on phase locked loop (PLL) and band-pass filters. Other methods may use FFT transform. These methods and devices suffer from a prolonged calculation time. In particular, level of harmonics is mostly unknown and PLL performance degrades when trying to lock on signals that get closer and closer to the sampling frequency. In view of current techniques for measuring power consumptions, there is a need for computing power simultaneously at the fundamental frequency or at a plurality of harmonic frequencies in near real time.

DETAILED DESCRIPTION OF EXAMPLE EMBODIMENTS

Embodiments of the present invention may provide a device and method for measuring power of an alternating current (AC) with respect to a selected frequency. In one embodiment, a measuring device may comprise two oscillators. The first oscillator may generate a local reference signal in a frequency detector to detect a fundamental frequency of the AC. The second oscillator may generate two substantially mutually orthogonal sinusoid signals having the selected frequency. The measuring device further may comprise a first group of multipliers that mixes the two sinusoid signals with a current and a voltage data signal of the AC respectively, a group of low-pass filters for removing high frequency components from the multiplication products, a second group of multipliers for mixing the filtered multiplication products respectively, and a plurality of adders each to sum together a pair of multiplication products of the second group of multipliers.

Another embodiment may provide a method for measuring power of an alternating current (AC) with respect to a selected frequency. The method may comprise detecting a fundamental frequency of the AC current by detecting a phase difference between a locally generated reference signal and an input data signal of the AC, generating a first and second substantially mutually orthogonal sinusoidal signals based on the detected fundamental frequency, multiplying the first and second sinusoidal signals of the pair with a current signal and a voltage signal of the AC current respectively, filtering the multiplication products respectively, and computing power of the AC current using the filtered multiplication products.

Figure 1:
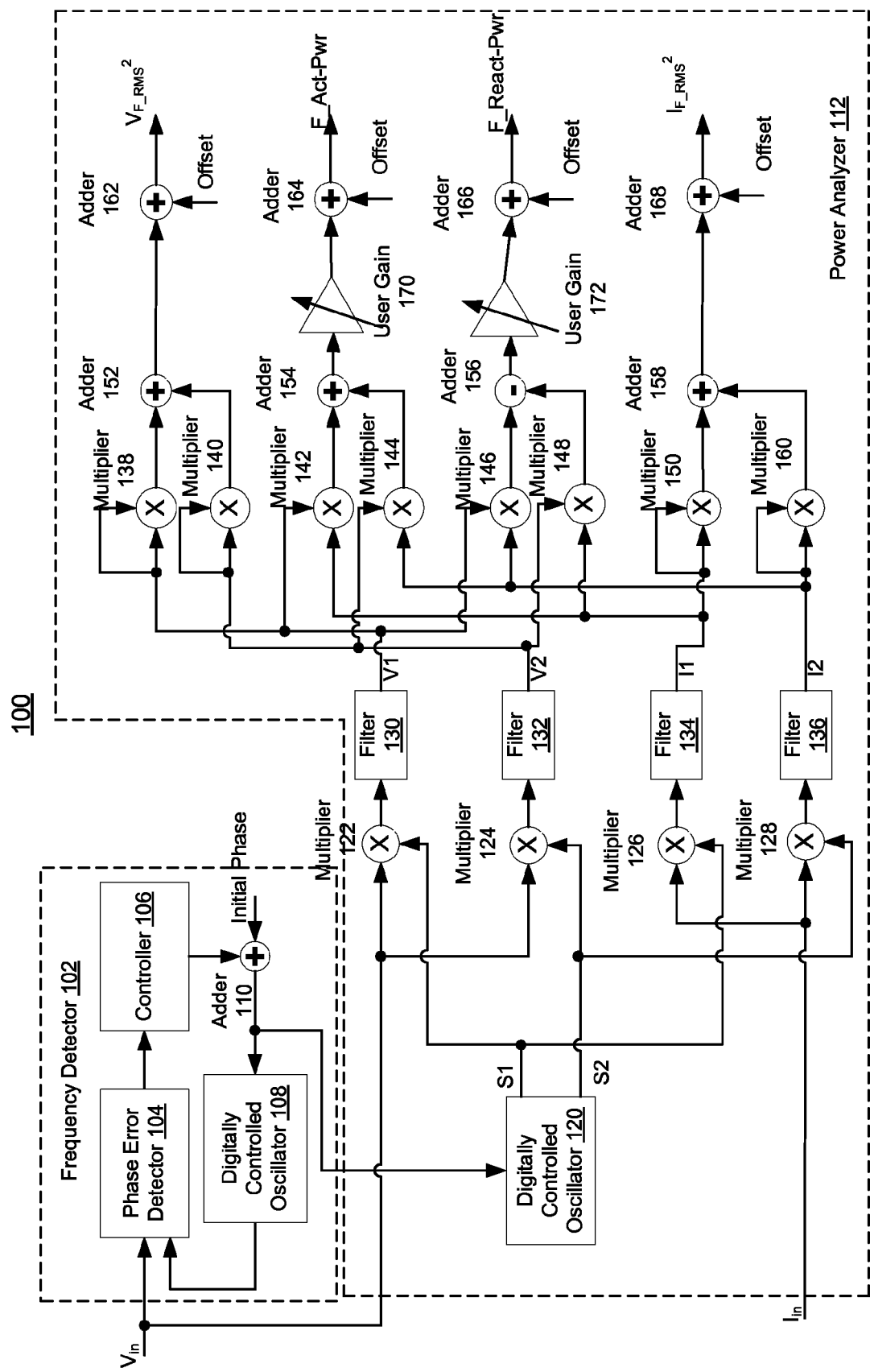
FIG. 1 shows a component-level diagram of a system for measuring power according to an exemplary embodiment of the present invention.

FIG. 1 shows a component-level diagram of a system 100 for measuring power of an AC current at a fundamental frequency according to an exemplary embodiment of the present invention. In one example embodiment, the input voltage and current signals may be digitized AC voltage and current signals (e.g., using an analog to digital converter (ADC)). The system 100 may comprise a frequency detector 102 to detect the fundamental frequency of the AC current and a power analyzer 112 to analyze power of the AC current at the detected fundamental frequency. In one embodiment, the analyzed power may include voltage and current root mean square (RMS), and active and reactive power of the AC current.

The frequency detector 102 may comprise a phase error detector 104, a controller 106, a digitally controlled oscillator 108 and an adder 110. The phase error detector 104 may receive an input signal $V_{in}$ and a local reference signal generated by the digitally controlled oscillator 108. The input signal $V_{in}$ may be a signal for one of three phases of a three-phase AC supply current (e.g., VA, VB, VC). The reference signal may be a sinusoidal signal with a frequency approximate the fundamental frequency of the AC current (e.g., an initial guess of the fundamental frequency). The phase error detector 104 may generate an output signal representing a phase comparison between the input signal $V_{in}$ and the local reference signal. The phase comparison may be sent to the controller 106. The controller 106 may generate a control signal indicating the detected fundamental frequency to be sent to the digitally controlled oscillator 108. The adder 110 may add an initial phase to the control signal for the local reference signal. The frequency detector 102 may operate by setting an initial frequency close to an actually frequency of the AC current (e.g., either 50 Hz or 60 Hz) and the controller 106 may adjust the frequency of the local reference signal to approach the real fundamental frequency of the input signal $V_{in}$ to reduce the phase error and detect the real fundamental frequency. In one embodiment, an accumulator may be included between the phase error detector 104 and the controller 106 to accumulate the detected phase error. Also, in one embodiment, the controller 106 may use one or more of proportional, integrative as known in the art and derivative processing and may summarize the results. Further, in one embodiment, the controller 106 may be a loop controller that update the frequency of the local reference signal in successive loops to approach the fundamental frequency of the AC current. Further description of the loop controller may be found in the co-pending application (application Ser. No. 13/097,796), the entire content of which is incorporated by reference herein.

The power analyzer 112 may comprise a digitally controlled oscillator 120, a first group of functional units to extract discrete frequency components and a second group of functional units to compute various power using the extracted discrete frequency components. The digitally controlled oscillator 120 may receive the control signal with initial phase from the frequency detector 102 and generate two sinusoidal signals S1 and S2 that are 90 degrees phase shifted (e.g., S1 being a sine signal and S2 being a cosine signal). In one embodiment, the digitally controlled oscillator 120 may be referred to as a dual DCO.

The first group of functional units of the power analyzer 112 that extract discrete frequency components may comprise a group of multipliers 122, 124, 126 and 128 and a plurality of filters 130, 132, 134 and 136. Each multiplier 122, 124, 126 and 128 may multiply the input voltage signal $V_{in}$ or an input current signal $I_{in}$ to one of the S1 and S2 generated by the digitally controlled oscillator 120, and the output of the each multiplier may be filtered by the filter 130, 132, 134 and 136 respectively to remove high frequency components. For example, the multiplier 122 may multiply S1 to $V_{in}$ and the multiplication result may be filtered by the filter 130. In one embodiment, the filters 130, 132, 134 and 136 may be any type and any order of low-pass filter (e.g., a finite impulse response (FIR) filter, infinite impulse response (IIR) filter). Selection of a certain type may depend on what is more desirable to a user, for example, low-ripple, efficient silicon area, fast settling time, sharp attenuation, and other selection criteria.

In one embodiment, the generated sine and cosine signals S1 and S2 may be represented as $S1=\sin(\omega_e \cdot t+\phi_r)$ and $S2=\cos(\omega_e \cdot t+\phi_r)$, in which $\omega_e=2\pi F_e$ with $F_e$ being the detected or estimated fundamental frequency of the AC current and $\phi r$ being a random phase offset (e.g., a phase shift). The input signals $V_{in}$ and $I_{in}$ may be represented by $$V_{in} = \sum_{k=1}^{N} A_{Vk} \cdot \cos(k \cdot \omega_s \cdot t + \varphi_{Vk}) \text{ and}$$

$$I_{in} = \sum_{k=1}^{N} A_{Ik} \cdot \cos(k \cdot \omega_s \cdot t + \varphi_{Ik}),$$

in which in which $\omega s=2\pi F_s$ with $F_s$ being the real fundamental frequency of the AC current and $\phi_{vk}$ or $\phi_{Ik}$ being an initial phase offset (e.g., a phase shift) for each harmonic frequency when K is larger than one. Assuming the detected frequency is close to the real fundamental frequency, the output signals V1, V2, I1 and I2 from the low pass filters 130, 132, 134 and 136 may be represented by the following equations $$V1 = \frac{A_{V1}}{2} \cdot \sin[(\omega e - \omega s) \cdot t + (\varphi r - \omega_{V1})] \cong \frac{A_{V1}}{2} \cdot \sin(\varphi r - \omega_{V1}),$$

$$V2 = \frac{A_{V1}}{2} \cdot \cos[(\omega e - \omega s) \cdot t + (\varphi r - \omega_{V1})] \cong \frac{A_{V1}}{2} \cdot \cos(\varphi r - \omega_{V1}),$$

$$I1 = \frac{A_{I1}}{2} \cdot \sin[(\omega e - \omega s) \cdot t + (\varphi r - \omega_{I1})] \cong \frac{A_{I1}}{2} \cdot \sin(\varphi r - \omega_{I1}),$$

$$I2 = \frac{A_{I1}}{2} \cdot \cos[(\omega e - \omega s) \cdot t + (\varphi r - \omega_{I1})] \cong \frac{A_{I1}}{2} \cdot \cos(\varphi r - \omega_{I1}).$$

The second group of functional units, the computational units, may comprise a pair of multipliers 138 and 140 and an adder 152 for computing the voltage root mean square of the fundamental frequency $V_{F\_RMS}^2$. The voltage root mean square of the fundamental frequency $V_{F\_RMS}^2$ may be obtained by using the adder 152 to add together the square of filter output V1 generated by the multiplier 140 and the square of filter output V2 generated by the multiplier 140, that is $V_{F\_RMS}^2 = V1^2 + V2^2$. An offset may be added to the calculated voltage root mean square $V_{F\_RMS}^2$ at an adder 162 to perform offset correction for the computed voltage root mean square $V_{F\_RMS}^2$. The computational units may further comprise a pair of multipliers 150 and 160 and an adder 168 for computing the current root mean square of the fundamental frequency $I_{F\_RMS}^2$. The current root mean square $I_{F\_RMS}^2$ may be obtained by using the adder 168 to add together the square of filter output I1 generated by the multiplier 150 and the square of filter output I2 generated by the multiplier 160, that is $I_{F\_RMS}^2 = I1^2 + I2^2$. An offset may be added to the current root mean square $I_{F\_RMS}^2$ at an adder 168 to perform offset correction for the computed current root mean square $I_{F\_RMS}^2$.

The computational units may further comprise a pair of multipliers 142 and 144 and an adder 154 for computing the active power of the fundamental frequency. The multiplier 142 may multiply the filter output V1 and I1, and the multiplier 144 may multiply the filter output V2 and I2. The multiplication results of the multipliers 142 and 144 may be added together by the adder 154, that is the computed active power of the fundamental frequency may be V1*I1+V2*I2. The computed active power of the fundamental frequency may be adjusted at a user gain stager 170 by a gain adjustment specified by the user. An offset may be added to the gain adjusted active power of the fundamental frequency at an adder 164 to perform offset correction for the computed active power of the fundamental frequency F_Act-Pwr.

The computational units may further comprise a pair of multipliers 146 and 148 and an adder 156 for computing the reactive power of the fundamental frequency. The multiplier 146 may multiply the filter output V1 and I2, and the multiplier 148 may multiply the filter output V2 and I1. At the adder 156, the multiplication result of the multiplier 146 may be subtracted (adding the negative) from the multiplication result of the multiplier 148, that is, the computed reactive power of the fundamental frequency may be V2*I1−V1*I2. The computed reactive power of the fundamental frequency may be adjusted at a user gain stager 172 by a gain adjustment specified by the user. An offset may be added to the gain adjusted reactive power of the fundamental frequency at an adder 166 to perform offset correction for the computed reactive power of the fundamental frequency F_React-Pwr.

In one embodiment, offset may be determined by computing a theoretical value of what is expected. Then that theoretical value may be compared with a value given by the harmonic analyzer (plus all the analog front-end). The difference may be the offset that can be programmed inside a power meter at a manufacturer and thus the result may be matched to the theory. In another embodiment, certain harmonic component may be forced to be zero and whatever non-zero value detected in this scenario will be the offset correction value that will make the harmonic analyzer detect a zero value.

In one embodiment, three frequency detectors 102 and three power analyzers 112 may be incorporated in one semiconductor chip with one frequency detector and power analyzer for each phase. That is, in this embodiment, $V_{F\_RMS}^2$, $I_{F\_RMS}^2$, F_Act-Pwr and F_React-Pwr for each phase may be calculated simultaneously.

Figure 2:
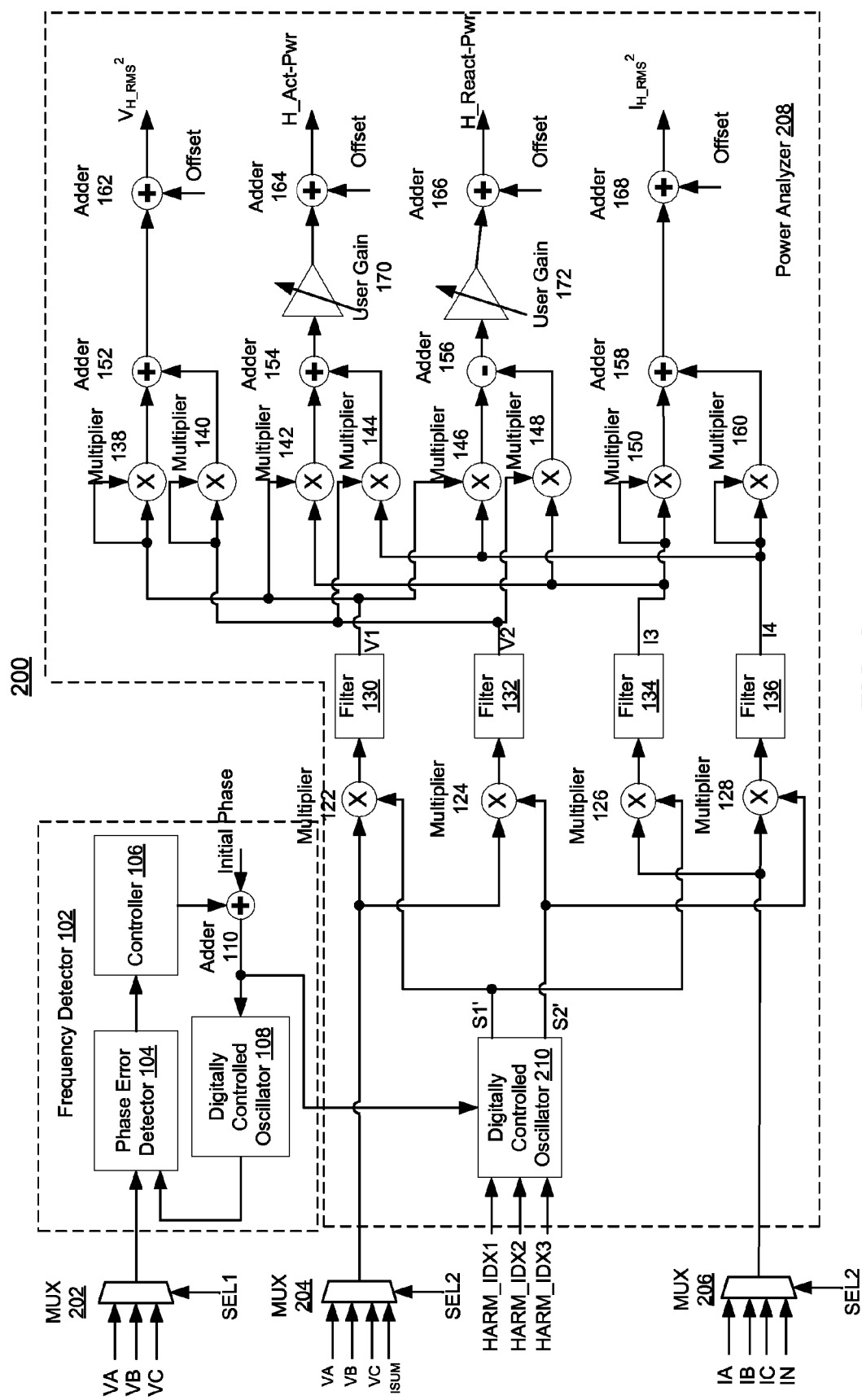
FIG. 2 shows a component-level diagram of a system for measuring power at harmonic frequencies according to an exemplary embodiment of the present invention.

FIG. 2 shows a component-level diagram of a system 200 for measuring power at a fundamental frequency or harmonic frequencies according to an exemplary embodiment of the present invention. In one example embodiment, the input voltage and current signals may be digitized AC voltage and current signals (e.g., using an analog to digital converter (ADC)). The system 200 may comprise a first multiplexer (MUX) 202, a second MUX 204, a third MUX 206, a frequency detector 102 of FIG. 1 to detect the fundamental frequency of the AC current and a power analyzer 208 to analyze power of the AC current at the detected fundamental frequency or selected harmonic frequencies. In one embodiment, the analyzed power may include voltage and current root mean square (RMS), and active and reactive power of the AC current of the fundamental frequency or selected harmonic frequencies.

The first MUX 202 may select one voltage VA, VB or VC of the three-phase AC voltage to be input to the frequency detector 102 according to a selection signal SEL1. SEL1 may allow the selection of one of VA, VB or VC to be used for extracting the frequency information for the harmonics power analysis.

The second MUX 204 may have an input of ISUM signal in addition to the phase voltages VA, VB and VC. The ISUM signal may be the sum of all the currents from the 3 phases: A, B and C. If all these currents are equal in amplitude, but separated in phase by 120 degrees, their instant sum should be zero (in theory). This ISUM may be provided for a user to verify things. The third MUX 206 may have an input of signal IN in addition to the currents of three phases IA, IB and IC. The signal IN may be the real neutral current that comes back on a separate wire in some topologies of distributing 3-phase power. In other topologies, the signal IN may come back through earth (e.g., grounded). By setting the value of SEL2 signal, a user may analyze harmonics on these two currents ISUM and IN.

The power analyzer 208 may comprise a digitally controlled oscillator 210 and functional units to extract discrete frequency components and functional units to compute various power. The digitally controlled oscillator 210 may differ from the digitally controlled oscillator 120 because it may generate sinusoidal signals S1' and S2' having harmonic frequencies instead of only the fundamental frequency detected by the frequency detector 102. That is, $S1'=\sin(k\cdot\omega_e\cdot t+\phi_r)$ and $S2'=\cos(k\cdot\omega_e\cdot t+\phi_r)$, in which k may be an integer larger than one, and $\omega_e=2\pi F_e$ with $F_e$ being the detected or estimated fundamental frequency of the AC current and (or being a random phase offset (e.g., a phase shift). During operation, any harmonic frequencies to be analyzed may be determined by three indexes HARM_IDX1, HARM_IDX2 and HARM_IDX3.

The power analyzer 208 may differ from the power analyzer 112 because of difference between the digitally controlled oscillator 210 and digitally controlled oscillator 120. The rest of the power analyzer 208 may be identical to that of the power analyzer 112 and may measure power of a selected harmonic frequency. The output V1, V2, I1 and I2 of the filters 130, 132, 134 and 136 may correspond to wave components of a selected harmonic frequency for analyzing, and the outputs may be voltage root mean square for the selected harmonic frequency $V_{H\_RMS}^2$, current root mean square for the selected harmonic frequency $I_{H\_RMS}^2$, active power for the selected harmonic frequency H_Act-Pwr and the reactive power for the selected harmonic frequency H_react-Pwr.

In one embodiment, one frequency detector 102 and may be shared by three power analyzers 208. The shared frequency detector 102 may be a frequency detector for any phase (e.g., A, B, or C) used in FIG. 1. In this embodiment, three power analyzers 208 may each include a dual DCO 210, and $V_{H\_RMS}^2$, $I_{H\_RMS}^2$, H_Act-Pwr and H_React-Pwr for three different harmonic frequencies may be calculated simultaneously. For example, the index HARM_IDX1 may be 9, HARM_IDX2 may be 15 and HARM_IDX3 may be 20. That is, in this embodiment, $V_{H\_RMS}^2$, $I_{H\_RMS}^2$, H_Act-Pwr and H_React-Pwr may be calculated for harmonics 9, 15 and 20 continuously for one of the phases A, B, C or ISUM & IN. In this embodiment, the frequency detector 102 and three power analyzers 208 may be incorporated in one semiconductor chip. That is, in this embodiment, three sets of power $V_{H\_RMS}^2$, $I_{H\_RMS}^2$, H_Act-Pwr and H_React-Pwr for three different harmonic frequencies may be calculated simultaneously.

Figure 3:
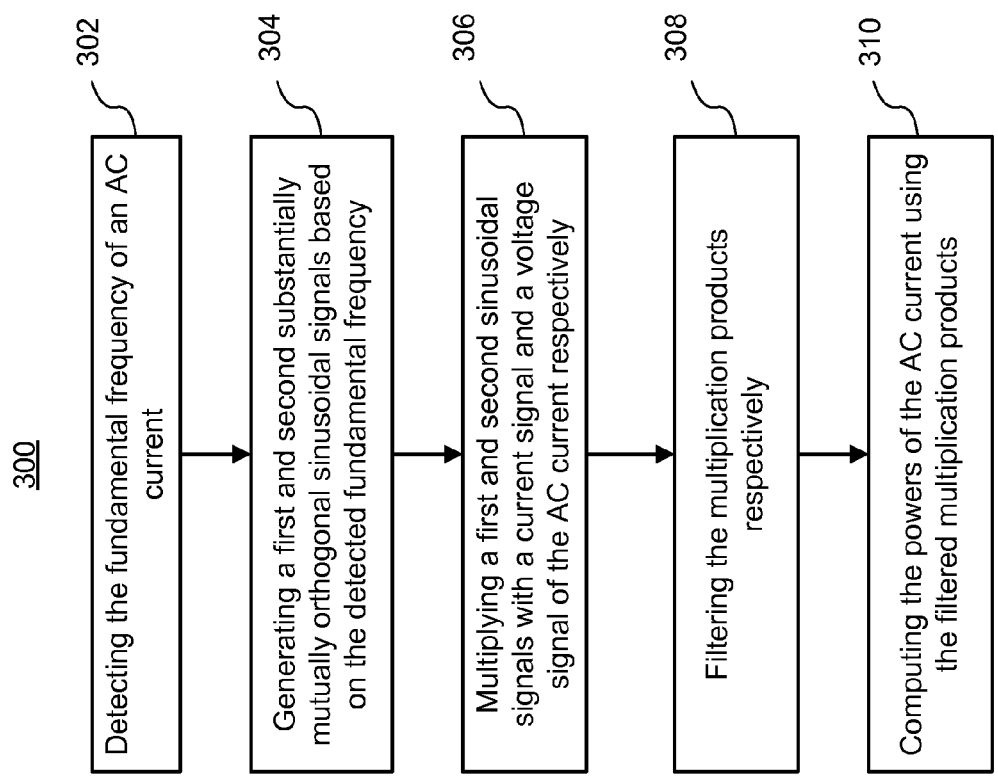
FIG. 3 shows an example process of calculating power at a fundamental frequency or at harmonic frequencies according to one example embodiment of the present invention.

FIG. 3 shows an example process 300 of calculating power at a fundamental frequency or at harmonic frequencies according to one example embodiment of the present invention. At block 302, a fundamental frequency of an AC current may be detected. As described above, an input voltage signal $V_{in}$ may be fed into a frequency detector which may detect the fundamental frequency by comparing to the input voltage signal to a locally generated reference signal having an initial phase, e.g., 50 Hz or 60 Hz. At block 304, a pair of substantially mutually orthogonal sinusoidal signals may be generated based on the detected fundamental frequency. As shown in FIGS. 1 and 2, the dual DCO 120 or dual DCO 210 may generate orthogonal, unit amplitude sinusoidal waveforms. At block 306, the first and second sinusoidal signals may be multiplied with a current signal and a voltage signal of the AC current respectively. As shown in FIGS. 1 and 2, the input voltage signal and current signal may be multiplied with the sinusoidal signals at the multipliers 122-128. At block 308, the multiplication products may be filtered respectively (e.g., by the filters 130-136 as shown in FIGS. 1 and 2 and described above).

Figure 4:
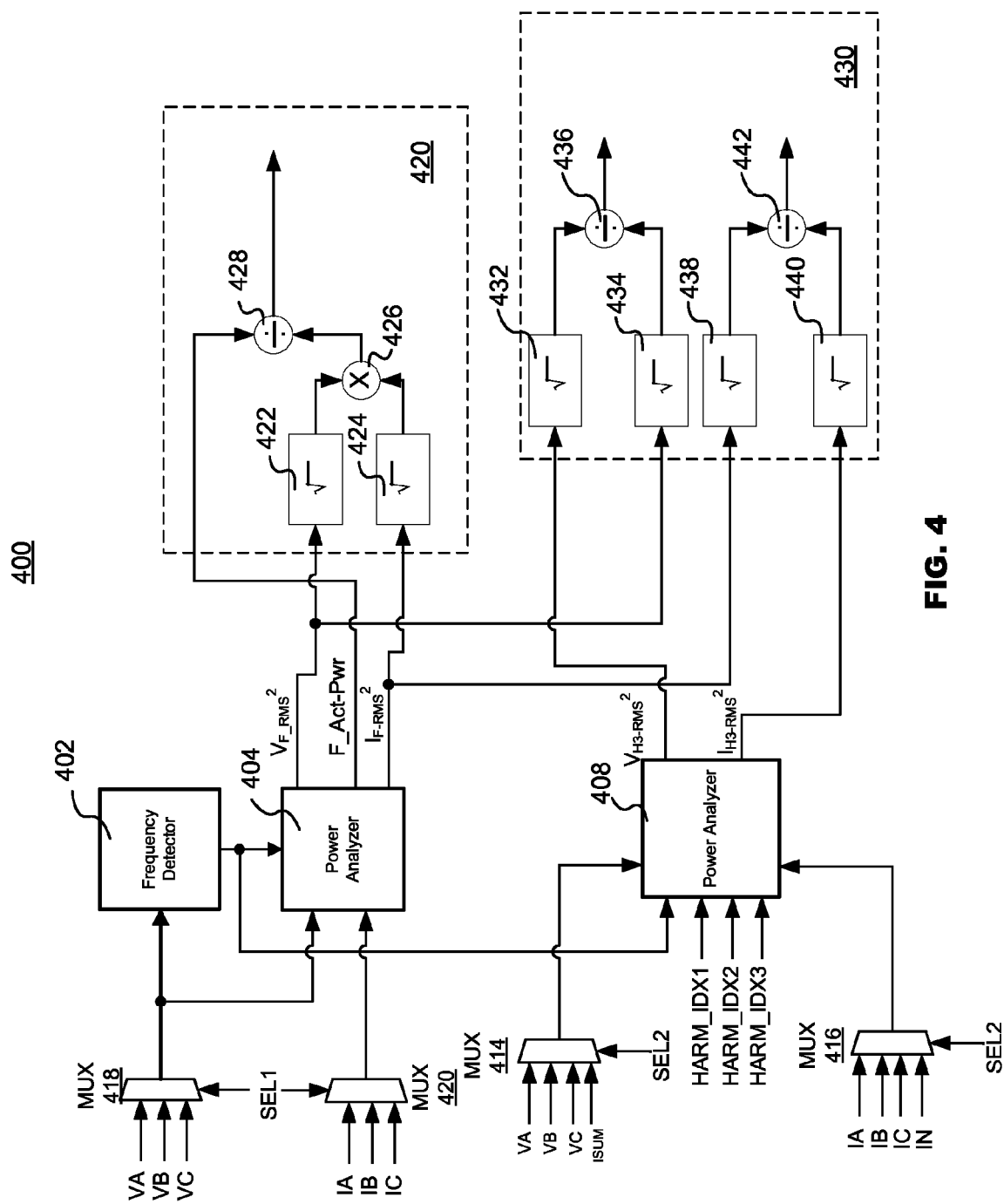
FIG. 4 shows a component-level diagram of a system performing further calculation based on measured fundamental and/or harmonic power according to one example embodiment of the present invention.

FIG. 4 shows a component-level diagram of a system 400 performing further calculation based on measured fundamental and/or harmonic power according to one example embodiment of the present invention. The system 400 may include a frequency detector 402, a first power analyzer 404 for power analysis for the fundamental frequency, a second power analyzer 408 for power analysis for a harmonic frequency, a real time power factor analyzer 420 and a real time harmonic distortion analyzer 430. In one embodiment, the system 400 may be incorporated in one semiconductor chip.

The frequency detector 402 may receive an input signal from a MUX 418, which may select one of the voltage signals VA, VB or VC of the three phases according to a SEL1 signal. The frequency detector 402 may be a frequency detector 102 as described above with respect to FIG. 1. The power analyzer 404 may receive a signal indicating the detected fundamental frequency from the frequency detector 402, the selected voltage signal from the MUX 418, and a corresponding current signal selected by the MUX 420 according to the SEL1 signal. The power analyzer 404 may be a power analyzer 112 as described above with respect to FIG. 1 for power analysis of the fundamental frequency and may output calculated powers $V_{F\_RMS}^2$, $I_{F\_RMS}^2$, F_Act-Pwr and F_React-Pwr (not shown).

The real time power factor analyzer 420 may include two square root calculators 422 and 424, a multiplier 426 and a divider 428. The square root calculator 422 may generate a square root of the $V_{F\_RMS}^2$ and the square root calculator 424 may generate a square root of the $I_{F\_RMS}^2$. The square root of the $V_{F\_RMS}^2$ and the square root of the $I_{F\_RMS}^2$ may be multiplied at the multiplier 426 to generate an apparent power APP_Pwr. The divider 428 may divide the active power F_Act-Pwr by the apparent power APP_Pwr to generate a power factor (e.g., F_Act-Pwr/APP_Pwr) for the fundamental frequency. Because the power analyzer 404 may generate power analysis at real time continuously, the real time power factor analyzer 420 may generate the power factor at real time too.

The power analyzer 408 may receive a signal indicating the detected fundamental frequency from the frequency detector 402, a selected voltage signal (one of the VA, VB, VC and ISUM signal) by a MUX 414, and a corresponding current signal (one of the IA, IB, IC and IN signal) selected by a MUX 416 according to the SEL2 signal. The power analyzer 408 may also receive three indexes HARM_IDX1, HARM_IDX2 and HARM_IDX3 to select a particular harmonic frequency to analyze. The power analyzer 408 may be a power analyzer 208 for power analysis of the fundamental frequency and may output calculated powers $V_{H3\_RMS}^2$, $I_{H3\_RMS}^2$, H_Act-Pwr (not shown) and F_React-Pwr (not shown).

The real time harmonic distortion analyzer 430 may include a first pair of square root calculators 432 and 434 to generate square roots of $V_{F\_RMS}^2$ and $V_{H3\_RMS}^2$ respectively, and a first divider 436 to generate a voltage harmonic distortion by dividing the square root of $V_{F\_RMS}^2$ by the square root of $V_{H3\_RMS}^2$. The real time harmonic distortion analyzer 430 may also include a second pair of square root calculators 438 and 440 to generate square roots of $I_{F\_RMS}^2$ and $I_{H3\_RMS}^2$ respectively, and a second divider 442 to generate a current harmonic distortion by dividing the square root of $I_{F\_RMS}^2$ by the square root of $I_{H3\_RMS}^2$. Because the power analyzer 408 may generate power analysis at real time continuously, the real time harmonic distortion analyzer 430 may generate harmonic distortion results at real time too.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A device for measuring power of an alternating current (AC) comprising:
    a frequency detector having a first oscillator to generate a local reference signal to detect a fundamental frequency of the AC and a controller to generate a control signal indicating the detected fundamental frequency of the AC; and
    a power analyzer to analyze power of the AC, the power analyzer comprising:
        a second oscillator, to receive the control signal from the frequency detector, to generate first and second substantially mutually orthogonal sinusoid signals at a programmable harmonic of the fundamental frequency;
        a first group of multipliers for mixing the first and second sinusoid signals with a current data signal and a voltage data signal of the AC respectively;
        a group of low-pass filters for respectively removing high frequency components from a multiplication product of the first group of multipliers;
        a second group of multipliers for respectively mixing the filtered multiplication products; and
        a plurality of adders each to sum together a pair of multiplication products of the second group of multipliers.

2. The device of claim 1, wherein the harmonic is programmed to be the first harmonic of the fundamental frequency of the AC.

3. The device of claim 1, wherein the harmonic is programmed to be greater than the first harmonic of the fundamental frequency.

4. The device of claim 3, further comprising a real time power factor analyzer that generates an output indicating a power factor in near real time.

5. The device of claim 1, wherein the measured power of the AC include active power, reactive power, voltage root mean square and current root mean square.

6. The device of claim 5, wherein the power analyzer further comprises a user gain stage to generate a gain adjustment for the active power and reactive power respectively.

7. The device of claim 1, wherein the power analyzer further comprises:
    a first multiplexer for selecting a voltage data signal of the AC for the frequency detector;
    a second multiplexer for selecting a voltage data signal of the AC for the first group of multipliers; and
    a third multiplexer for selecting a current data signal of the AC for the first group of multipliers.

8. The device of claim 7, wherein the second multiplexer includes an ISUM signal for selection, the ISUM signal represents a sum of all the currents from the 3 phases, and third multiplexer includes an IN signal option for selection, the IN signal represents a real neutral current that comes back on a separate wire in the 3-phase AC.

9. The device of claim 8, further comprising:
    a second power analyzer, and a near real time harmonic distortion analyzer, wherein one of the power analyzers generates power outputs for the fundamental frequency and another of the power analyzers generates power for a harmonic frequency, the near real time harmonic distortion analyzer generates outputs indicating harmonic distortion in voltage and current.

10. The device of claim 1, wherein each of the low-pass filters is a second-order infinite impulse response (IIR) filter.

11. The device of claim 1, wherein the first oscillator generates the local reference signal using an estimated initial frequency approximate the fundamental frequency of the AC.

12. A method for measuring power of an alternating current (AC) comprising:
   detecting a fundamental frequency of the AC current by detecting a phase difference between a locally generated reference signal and an input data signal of the AC;
   generating a control signal indicating the detected fundamental frequency having an initial phase;
   generating a first and second substantially mutually orthogonal sinusoidal signals at a programmable harmonic of the detected fundamental frequency;
   multiplying the first and second sinusoidal signals of the pair with a current signal and a voltage signal of the AC current respectively;
   filtering the multiplication products respectively; and
   computing power of the AC current using the filtered multiplication products.

13. The method of claim 12, wherein the harmonic is programmed to be the first harmonic of the fundamental frequency of the AC.

14. The method of claim 12, wherein the harmonic is programmed to be greater than the first harmonic of the fundamental frequency.

15. The method of claim 12, wherein the measured power of the AC include active power, reactive power, voltage root mean square and current root mean square.

16. The method of claim 15, wherein the computed active power and reactive power are adjusted by a user gain stage respectively.

17. The method of claim 12, wherein:
   the input data signal of the AC to a frequency detector is selected by a first multiplexer from one of phase voltages of the AC,
   the voltage data signal of the AC for the first group of multipliers is selected by a second multiplexer from one of phase voltages of the AC and an ISUM signal representing a sum of all the currents from the 3 phases; and
   the current data signal of the AC for the first group of multipliers is selected by a third multiplexer from one of phase currents of the AC and an IN signal representing a real neutral current that comes back on a separate wire in the 3-phase AC.

18. The method of claim 12, wherein filtering is performed on the multiplication products by a plurality of second-order infinite impulse response (IIR) filters respectively.

19. The method of claim 12, wherein the local reference signal is generated using an estimated initial frequency approximate the fundamental frequency of the AC.

20. The method of claim 12, further comprising measuring harmonic distortion in voltage and current in near real time.

21. The method of claim 12, further comprising measuring a power factor in near real time.

22. An article of manufacture comprising a machine-readable storage medium having stored thereon instructions adapted to be executed by a processor to perform a method for measuring power of an alternating current (AC) comprising:
   detecting a fundamental frequency of the AC by detecting a phase difference between a locally generated reference signal and an input data signal of the AC;
   generating a control signal indicating the detected fundamental frequency having an initial phase;
   generating a first and second substantially mutually orthogonal sinusoidal signals at a programmable harmonic of the detected fundamental frequency;
   multiplying the first and second sinusoidal signals of the pair with a current signal and a voltage signal of the AC current respectively;
   filtering the multiplication products respectively; and
   computing power of the AC current using the filtered multiplication products.

23. The article of manufacture of claim 22, wherein the harmonic is programmed to be the first harmonic of the fundamental frequency of the AC.

24. The article of manufacture of claim 22, wherein the harmonic is programmed to be greater than the first harmonic of the fundamental frequency.

25. The article of manufacture of claim 22, wherein the measured power of the AC include active power, reactive power, voltage root mean square and current root mean square.

26. The article of manufacture of claim 25, wherein the computed active power and reactive power are adjusted by a user gain stage respectively.

27. The article of manufacture of claim 22, wherein:
   the input data signal of the AC to a frequency detector is selected by a first multiplexer from one of phase voltages of the AC,
   the voltage data signal of the AC for the first group of multipliers is selected by a second multiplexer from one of phase voltages of the AC and an ISUM signal representing a sum of all the currents from the 3 phases; and
   the current data signal of the AC for the first group of multipliers is selected by a third multiplexer from one of phase currents of the AC and an IN signal representing a real neutral current that comes back on a separate wire in the 3-phase AC.

28. The article of manufacture of claim 22, wherein filtering is performed on the multiplication products by a plurality of second-order infinite impulse response (IIR) filters respectively.

29. The article of manufacture of claim 22, wherein the local reference signal is generated using an estimated initial frequency approximate the fundamental frequency of the AC.

30. The article of manufacture of claim 22, further comprising measuring harmonic distortion in voltage and current in near real time.

31. The article of manufacture of claim 22, further comprising measuring a power factor in near real time.

32. The device of claim 1, wherein:
   the first group of multipliers comprises at least four multipliers;
   the group of low-pass filters comprises at least four low-pass filters;
   the second group of multipliers comprises at least two multipliers; and
   the plurality of adders comprises at least two adders.

33. The device of claim 1, further comprising a plurality harmonic indexes, one of which is used to generate the first and second substantially mutually orthogonal sinusoid signals at the harmonic of the fundamental frequency.

34. The method of claim 14, wherein the first and second substantially mutually orthogonal sinusoid signals are further generated based on one of a plurality of harmonic indexes.

35. The article of manufacture of claim 24, wherein the first and second substantially mutually orthogonal sinusoid signals are further generated based on one of a plurality of harmonic indexes.

36. A power analyzer device to measure power of an alternating current (AC) at a selected harmonic frequency, the power analyzer comprising:
- an oscillator to generate first and second substantially mutually orthogonal sinusoid signals at the selected harmonic frequency based on a fundamental frequency of the AC and at least one harmonic index selected from a plurality of harmonic indexes, wherein the fundamental frequency of the AC is indicated by a control signal received externally to the power analyzer;
- a first group of multipliers for mixing the first and second sinusoid signals with a current data signal and a voltage data signal of the AC respectively;
- a group of low-pass filters for respectively removing high frequency components from a multiplication product of the first group of multipliers;
- a second group of multipliers for respectively mixing the filtered multiplication products; and
- a plurality of adders each to sum together a pair of multiplication products of the second group of multipliers.

37. The device of claim 36, further comprising a real time power factor analyzer to generate an output indicating a power factor in near real time.

38. The device of claim 36, wherein the measured power of the AC includes active power, reactive power, voltage root mean square and current root mean square.

39. The device of claim 38, further comprising a user gain stage to generate a gain adjustment for the active power and reactive power respectively.

40. The device of claim 36, further comprising:
- a first multiplexer for selecting a voltage data signal of the AC for the first group of multipliers; and
- a second multiplexer for selecting a current data signal of the AC for the first group of multipliers.

41. The device of claim 40, wherein the first multiplexer includes an ISUM signal for selection, the ISUM signal represents a sum of all the currents from the 3 phases, and the second multiplexer includes an IN signal option for selection, the IN signal representing a real neutral current that comes back on a separate wire in the 3-phase AC.

42. The device of claim 36, wherein:
- the first group of multipliers comprises at least four multipliers;
- the group of low-pass filters comprises at least four low-pass filters;
- the second group of multipliers comprises at least two multipliers; and
- the plurality of adders comprises at least two adders.

43. A power analyzer device to measure power of an alternating current (AC), the power analyzer comprising:
- an oscillator to generate first and second substantially mutually orthogonal sinusoid signals at a programmable harmonic of a fundamental frequency of the AC, wherein the fundamental frequency of the AC is indicated by a control signal received externally to the power analyzer;
- a first group of multipliers for mixing the first and second sinusoid signals with a current data signal and a voltage data signal of the AC respectively;
- a group of low-pass filters for respectively removing high frequency components from a multiplication product of the first group of multipliers;
- a second group of multipliers for respectively mixing the filtered multiplication products; and
- a plurality of adders each to sum together a pair of multiplication products of the second group of multipliers.

44. The device of claim 43, further comprising a plurality harmonic indexes, one of which is used to generate the first and second substantially mutually orthogonal sinusoid signals at the harmonic of the fundamental frequency.

* * * * *